(12) United States Patent
Tawara

(10) Patent No.: US 8,578,993 B2
(45) Date of Patent: Nov. 12, 2013

(54) WAFER BONDING APPARATUS

(75) Inventor: Satoshi Tawara, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 153 days.

(21) Appl. No.: 12/921,653

(22) PCT Filed: Nov. 21, 2008

(86) PCT No.: PCT/JP2008/071232
§ 371 (c)(1),
(2), (4) Date: Nov. 10, 2010

(87) PCT Pub. No.: WO2010/058481
PCT Pub. Date: May 27, 2010

(65) Prior Publication Data
US 2011/0209832 A1 Sep. 1, 2011

(51) Int. Cl.
*B32B 37/00* (2006.01)

(52) U.S. Cl.
USPC .......................................... 156/382; 156/581

(58) Field of Classification Search
USPC .............. 156/228, 580, 581, 583.1, 381, 382; 100/315, 258 R, 258 A
See application file for complete search history.

(56) References Cited

U.S. PATENT DOCUMENTS 5,908,595 A * 6/1999 Cornils et al. ................ 264/252

FOREIGN PATENT DOCUMENTS

| JP | 9-321097 A | 12/1997 |
| JP | 2001-230277 A | 8/2001 |
| JP | 2004-268113 A | 9/2004 |
| JP | 2005-52841 A | 3/2005 |
| JP | 2005-268766 A | 9/2005 |
| JP | 2006-134899 A | 5/2006 |
| JP | 2006-222436 A | 8/2006 |
| JP | 2007-301593 A | 11/2007 |
| WO | WO 2004/049427 A1 | 6/2004 |

OTHER PUBLICATIONS

European Search Report for the corresponding EP application mailed Mar. 5, 2012.
Office Action in corresponding Chinese Application No. 200880127924.0 mailing date Jun. 13, 2012, with English translation of relevant portions.

* cited by examiner

*Primary Examiner* — James Sells
(74) *Attorney, Agent, or Firm* — Birch, Stewart, Kolasch & Birch, LLP

(57) ABSTRACT

A wafer bonding apparatus of the present invention includes a first sample base configured to hold a first substrate; a second sample base configured to hold a second substrate to oppose to the first substrate; a load transferring section coupled to an outer edge portion of the first sample base and configured to support the first sample base to a first stage; and a drive unit configured to perform pressure bonding on the first substrate and the second substrate by driving the second sample base to the first stage. In the wafer bonding apparatus, it is possible to prevent that a load which is larger than a load applied on the outer edge portion of the first substrate is applied to the center of the first substrate, and to apply uniform load the first substrate and the second substrate, when pressure bonding is performed on the first substrate and the second substrate.

5 Claims, 7 Drawing Sheets

WAFER BONDING APPARATUS

TECHNICAL FIELD

The present invention is related to a wafer bonding apparatus, and more particularly to a wafer bonding apparatus configured to perform pressure bonding on two substrates.

BACKGROUND ART

A MEMS device is known in which minute electrical parts and machine parts are integrated. As such a MEMS device, a micro-relay, a pressure sensor, an acceleration sensor and so on are exemplified. The MEMS device is desired to have a high bonding strength and to be manufactured by using a room-temperature bonding technique which does not need a pressing process due to load and a heating process.

A wafer bonding method is also known in which a plurality of devices are formed on a bonding substrate obtained by bonding two substrates with a plurality of patterns. In the method, it is desired to improve a yield of the plurality of devices and to apply a load on the bonding plane more uniformly.

In Japanese Patent Publication (JP-A-Heisei 09-321097), a pressing apparatus is disclosed in which even when contact surfaces of bumps on a work with the bumps are inclined, all the bumps can be pressed against an electrode of a work with uniform force. The pressing apparatus of the work with bumps includes a pressing body driven by a driving unit to move up and down, and an elastic member attached to the lower surface of the pressing body and pressed to the upper surface of the work with bumps. A concave portion is formed in the lower surface of the pressing body in order to permit that the elastic member is expanded into an upper direction to elastically deform.

In Japanese Patent Publication (JP 2007-301593A), a pressing apparatus is disclosed in which uniform pressure can be applied on a pressure surface of a pressure object. In the pressing apparatus, the pressure is applied to the pressure object by a pressure head. The pressure head has a first space section on a pressure axis of a pressing section.

DISCLOSURE OF THE INVENTION

The subject matter of the present invention is to provide a wafer bonding apparatus in which a load is uniformly applied to bonding surfaces of substrates.

A wafer bonding apparatus of the present invention includes a first sample base configured to hold a first substrate; a second sample base configured to hold a second substrate to oppose to the first substrate; a load transferring section coupled to an outer edge portion of the first sample base and configured to support the first sample base to a first stage; and a drive unit configured to perform pressure bonding on the first substrate and the second substrate by driving the second sample base to the first stage. In the wafer bonding apparatus, it is possible to prevent that a load which is larger than a load applied on the outer edge portion of the first substrate is applied to the center of the first substrate, and to apply uniform load the first substrate and the second substrate, when pressure bonding is performed on the first substrate and the second substrate.

The wafer bonding apparatus according to the present invention further includes an angle adjusting mechanism configured to support a first sample base to a first stage through the load transferring section. That is, the load transferring section is preferable for the wafer bonding apparatus which includes such an angle adjusting mechanism.

The angle adjusting mechanism includes a spherical flange fixed on the first sample base; a spherical base fixed on the first stage; and a fixation flange configured to fix the sphere flange on the sphere base by swaging the sphere flange. That is, the load transferring section is preferable for the wafer bonding apparatus which includes such a spherical flange, spherical base and fixation flange.

The angle adjusting mechanism is in line-contact with the load transferring section such that the load transferring section is supported by the angle adjusting mechanism. At this time, the load transferring section is preferable in that the movement from the angle adjusting mechanism to a position to which load is applied is very less.

The load transferring section includes a plurality of columnar members, each of which is coupled at one end to the outer edge portion of the first sample base and at the other end to the angle adjusting mechanism.

The load transferring section includes a plurality of columnar members, which deform elastically such that the first substrate and the second substrate fit to each other when the pressure bonding of the first substrate and the second substrate is performed.

BEST MODE FOR CARRYING OUR THE INVENTION

Figure 1:
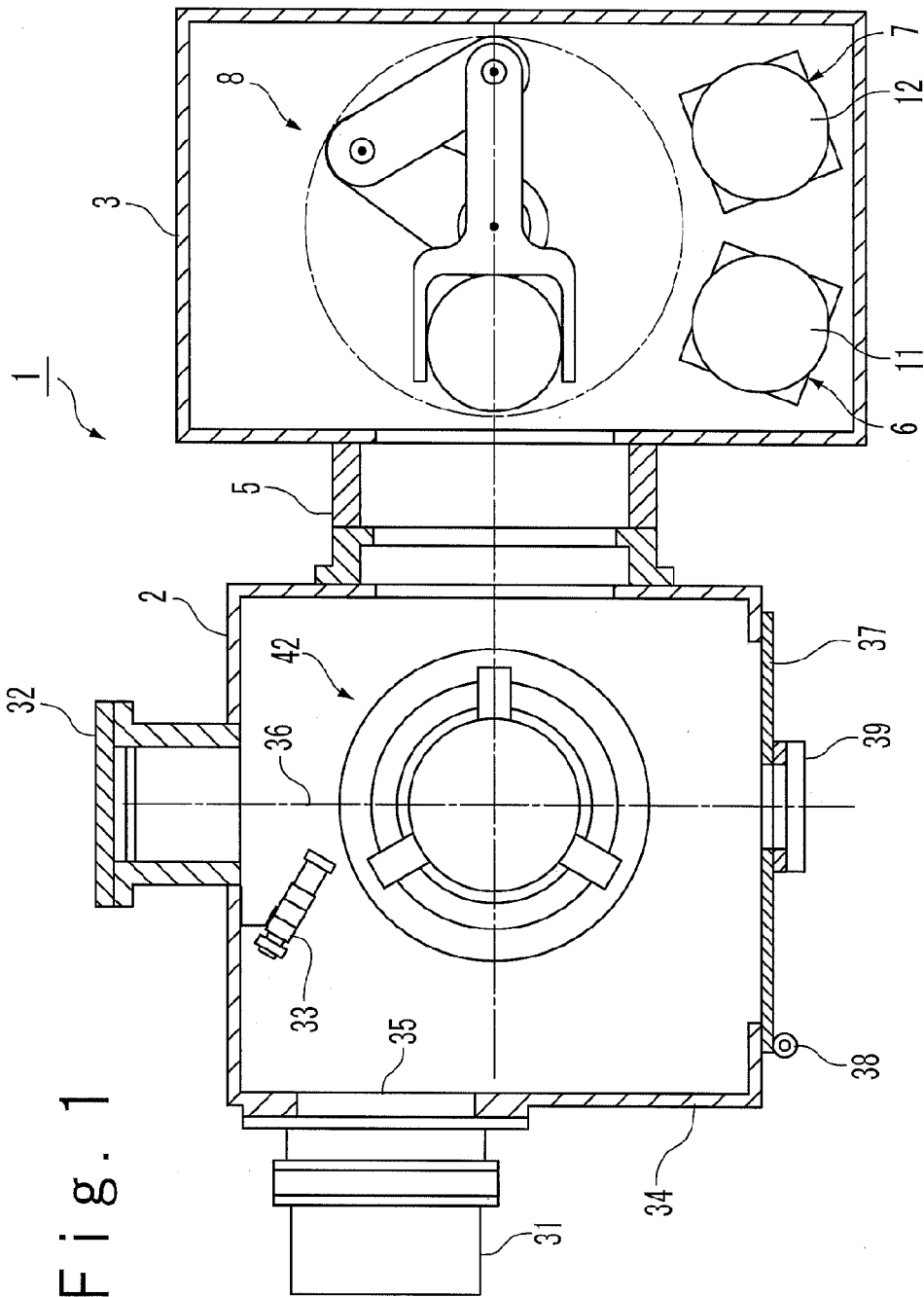
FIG. 1 is a sectional view showing a wafer bonding apparatus according to the present invention.

Referring to the attached drawings, a wafer bonding apparatus according to an embodiment of the present invention will be described in detail. The wafer bonding apparatus 1 includes a bonding chamber 2 and a load lock chamber 3, as shown in FIG. 1. The bonding chamber 2 and the load lock chamber 3 are formed as containers in which the internal spaces are shielded from external environment. Moreover, the wafer bonding apparatus 1 includes a gate valve 5. The gate valve 5 is interposed between the bonding chamber 2 and the load lock chamber 3 and is operated to close and open a gate which connects the internal space of the bonding chamber 2 and the internal space of the load lock chamber 3.

The load lock chamber 3 includes an upper cartridge base 6, a lower cartridge base 7, and a conveyer unit 8 in the internal space. An upper cartridge 11 is provided on the upper cartridge base 6, and a lower cartridge 12 is provided on the lower cartridge base 7. Moreover, the load lock chamber 3 includes a vacuum pump and a lid, which are not shown. The vacuum pump evacuates the internal space of the load lock chamber 3. As the vacuum pump, a turbo-molecular pump is exemplified which exhausts by flicking gaseous molecules by a plurality of metal wings. The lid closes the gate which connects the inside and outside of the load lock chamber 3 so that the internal space of the chamber 3 is set to atmosphere. The inner size of the gate is larger than the outer sizes of the upper cartridge 11 and lower cartridge 12.

The conveyer unit 8 conveys the upper cartridge 11 and the lower cartridge 12 from the load lock chamber 3 to the bonding chamber 2 through the gate valve 5, and conveys the upper cartridge 11 and the lower cartridge 12 from the bonding chamber 2 to the load lock chamber 3 through the gate valve 5.

The bonding chamber 2 includes a vacuum pump 31, an ion gun 32 and an electron gun 33. In the bonding chamber 2, an exhaust vent 35 is formed in a part of a wall 34 of the chamber 2. The vacuum pump 31 is arranged outside the bonding chamber 2 and exhausts gas through the exhaust vent 35 from the internal space of the bonding chamber 2. As the vacuum pump 31, a turbo-molecular pump is exemplified which exhausts gas by flicking gaseous molecules by plurality of metal wings. The ion gun 32 is arranged to be directed to one irradiation direction 36 and irradiates accelerated charged particles into the irradiation direction 36. As the charged particles, argon ions are exemplified. Another surface cleaning unit may be used to clean up the surface of a wafer in place of the ion gun 32. As the other surface cleaning unit, a plasma gun, a high-speed atom beam source and so on are exemplified. The electron gun 33 is arranged to be directed to an object to which the charged particles are irradiated from the ion gun 32, and irradiates accelerated electrons to the object.

The wall 34 is provided with a door 37 which is formed in a part of the wall. The door 37 is provided with a hinge 38. The hinge 38 turnably supports the door 37 to the wall 34. Moreover, the door 34 is provided a window 39 formed in a part of the door. The window 39 is formed of material which transmits light without transmitting gas. The window 39 may be arranged at anywhere of the wall 34 if a user can see the object to which the charged particles are irradiated from the ion gun 32 or a bonding state of the object from outside the bonding chamber 2.

Figure 2:
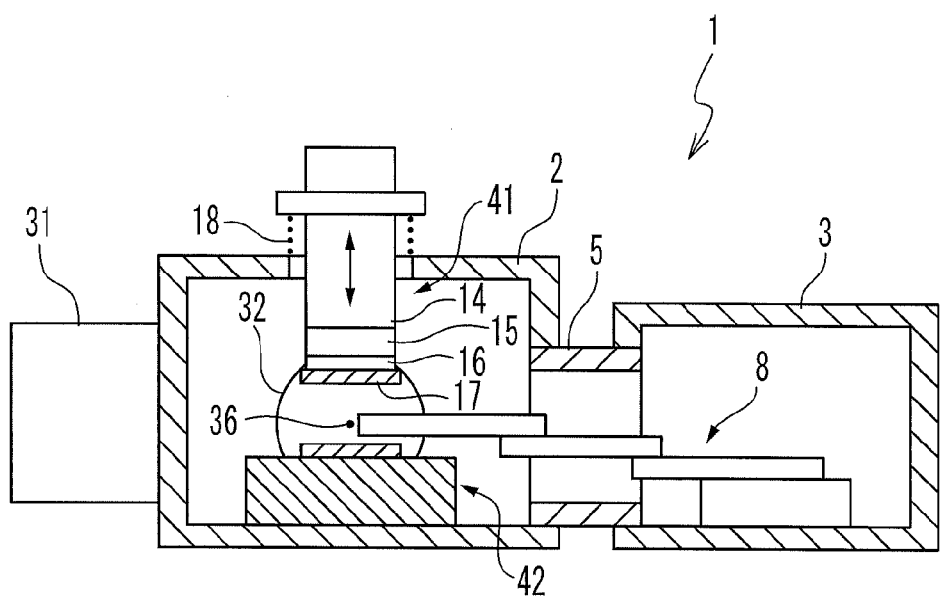
FIG. 2 is a sectional view showing the wafer bonding apparatus.

As shown in FIG. 2, the bonding chamber 2 further includes an upper substrate supporting section 41 and a lower substrate supporting section 42. The lower substrate supporting section 42 is arranged in a lower portion of the bonding chamber 2. The upper substrate supporting section 41 includes an upper stage 14, an angle adjusting mechanism 15, a load transferring section 16, an upper sample base 17 and a pressure bonding mechanism 18. The upper stage 14 is supported movably in a vertical direction to the bonding chamber 2. The angle adjusting mechanism 15 supports the load transferring section 16 to the upper stage 14. The load transferring section 16 supports the upper sample base 17 to the angle adjusting mechanism 15. The upper sample base 17 includes a dielectric layer in the lower tip, applies voltage between the dielectric layer and the substrate or wafer to adhere the substrate or wafer to the dielectric layer with electrostatic force. The pressure bonding mechanism 18 moves the upper stage 14 in the vertical direction to the bonding chamber 2 in accordance with an operation of the user.

The ion gun 32 is directed to the inner surface of a portion of the wall 34 of the bonding chamber 2 and a space between the substrate supported by the upper substrate supporting section 41 and the substrate supported by a lower substrate supporting section 42 when the substrate supported by the upper substrate supporting section 41 and the substrate supported by the lower substrate supporting section 42 are separated from each other. That is, the irradiation direction 36 of the ion gun 32 passes through the space between the substrate supported by the upper substrate supporting section 41 and the substrate supported by the lower substrate supporting section 42, and intersects the inner surface of the portion of the wall 34 of the bonding chamber 2.

Figure 3:
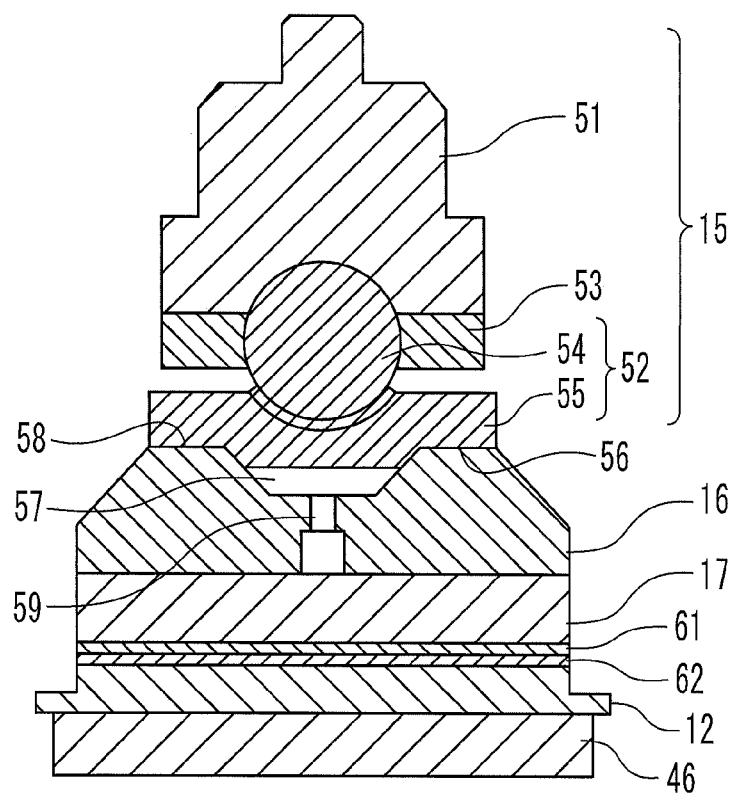
FIG. 3 is a sectional view showing an angle adjusting mechanism, a load transferring section and a lower sample base.

As shown in FIG. 3, the lower substrate supporting section 42 includes a lower sample base 46. The lower sample base 46 is formed in the form of a disk. In the lower sample base 46, a flat support plane is formed on the upper surface of a circular column. The lower sample base 46 is used to hold a lower wafer 62 from the lower cartridge 12. Moreover, the lower substrate supporting section 42 includes an alignment unit and a positioning mechanism (which are not shown). The alignment unit picks up an image of an alignment mark formed on the wafer or substrate which is held by the lower sample base 46, in accordance with an operation of the user. Moreover, the alignment unit picks up an image of an alignment mark formed on the wafer which is held by the upper sample base 17, in accordance with an operation of the user, when the upper sample base 17 becomes close to the lower sample base 46. The positioning mechanism moves the lower sample base 46 in a horizontal direction to the bonding chamber 2 and rotates the lower sample base 46 around a rotation axis parallel to the vertical direction.

As shown in FIG. 3, the angle adjusting mechanism 15 includes a spherical base 51, a spherical flange 52 and a fixation flange 53. The spherical base 51 is fixed on the upper stage 14 to form a spherical base surface. The spherical flange 52 is formed from a flange section 54 and a supporting section 55. The flange section 54 is formed in a spherical shape to fit to the spherical base surface of spherical base 51. The supporting section 55 is formed in a disk shape. The supporting section 55 is in contact with the flange section 54 in the center of the disk and a support surface 56 is formed on a back face 56 of the supporting section 55 opposing to the surface contacting the flange section 54. The fixation flange 53 is coupled with the flange section 54 of spherical flange 52 by the swaging fixation. That is, the fixation flange 53 is formed from split ring portions. The split ring portions are arranged to put the flange section 54 of the spherical flange 52 between the split ring portions, and couple to each other by bolts (not shown), in order to couple the fixation flange 53 to flange section 54 of the spherical flange 52. Moreover, the fixation flange 53 is coupled to the spherical base 51 by coupling member such as bolts so that the spherical base surface of the spherical base 51 fits with the flange section 54 of spherical flange 52.

Figure 4:
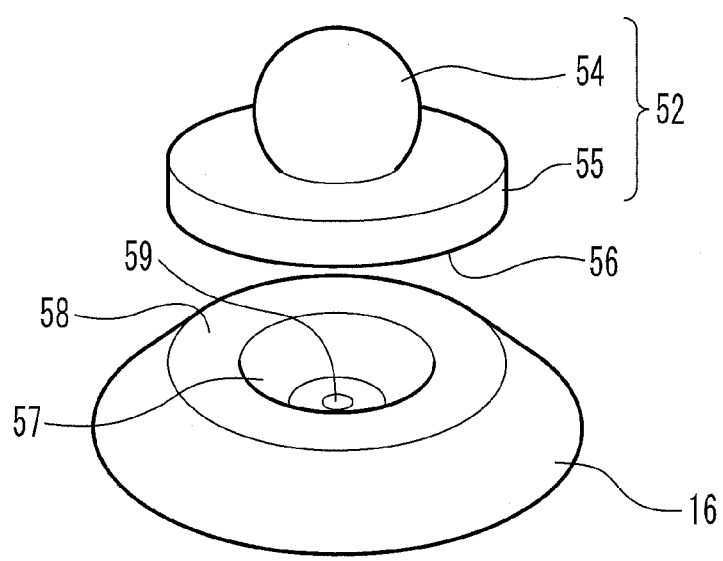
FIG. 4 is a perspective view showing the load transferring section.

As shown in FIG. 4, the load transferring section 16 is formed in the form of a disk. The load transferring section 16 has a concave section in the center portion and a support surface 58 is formed on the upper surface. The support surface 58 is flat and is formed to be surrounded by two concentric circles. The load transferring section 16 has a bolt hole 59 at the center of the disk. In the load transferring section 16, the bolt (not shown) is inserted in the bolt hole 59 and is screwed with the supporting section 55 of the spherical flange 52 as shown in FIG. 3. In this way, the load transferring section 16 is supported to the spherical flange 52 such that the support surface 58 is fit to the support surface 56, and a cavity 57 is formed at the center of the load transferring section 16 attached to the supporting section 55 of the spherical flange 52.

Moreover, the upper sample base 17 is coupled to the back surface of the load transferring section 16 opposing to the support surface 58. The upper sample base 17 is formed in the shape of a disk and the upper sample base 17 includes the dielectric layer on the back surface opposing to the surface coupled to the load transferring section 16. The upper sample base 17 attaches the upper wafer 61 to the dielectric layer with the electrostatic force by applying a voltage to the dielectric layer.

In an operation of bonding wafers by using the wafer bonding apparatus 1, an operator first measures an orientation of the upper sample base 17. The operator adjusts an angle by using the angle adjusting mechanism 15 so that the surface of the upper sample base 17 and the surface of the lower sample base 46 are in parallel to each other, when the surface of the upper sample base 17 for the upper wafer 61 and the surface of the lower sample base 46 for the lower wafer 62 are not parallel to each other. That is, the operator performs the swaging fixation of the spherical flange 52 to the fixation flange 53 and fixes the fixation flange 53 to the spherical base 51 so as to keep the surface of the upper sample base 17 and the surface of the lower sample base 46 parallel.

Next, the operator closes the gate valve 5, generates a vacuum atmosphere inside the bonding chamber 2 by using the vacuum pump 31, and generates an ordinary pressure atmosphere inside the load lock chamber 3. The operator opens the lid of the load lock chamber 3 and arranges the upper cartridge 11 on the upper cartridge base 6 and arranges the lower cartridge 12 on the lower cartridge base 7. Then, the operator puts the upper wafer 61 on the upper cartridge 11, and puts the lower wafer 62 on the lower cartridge 12. Next, the operator closes the lid of the load lock chamber 3, and generates a vacuum atmosphere inside the load lock chamber 3.

After the vacuum atmosphere is generated inside the load lock chamber 3, the operator opens the gate valve 5. At first, the operator sets the upper wafer 61 on the upper sample base 17. The operator conveys the upper cartridge 11 mounted with the upper wafer 61 to the lower sample base 46 by the conveyer unit 8 to hold the upper cartridge 11. The operator accommodates the conveyer unit 8 inside the load lock chamber 3. Next, the operator operates to lower the upper sample base 17 in the vertical direction, to make the dielectric layer of the upper sample base 17 contact the upper wafer 61, and to hold the upper wafer 61 by the upper sample base 17. The operator operates to raise the upper sample base 17 in the up direction so as to separate the upper wafer 61 from the upper cartridge 11. After the upper wafer 61 is removed from the upper cartridge 11, the operator conveys the upper cartridge 11 on which there is not the upper wafer 61, from the lower sample base 46 to the upper cartridge base 6 by the conveyer unit 8. After the upper wafer 61 is set to the upper sample base 17, the operator conveys the lower cartridge 12 mounted with the lower wafer 62 to the lower sample base 46 by the conveyer unit 8 to hold the lower cartridge 12.

The operator closes the gate valve 5, and performs the pressure bonding of the upper wafer 61 held by the upper sample base 17 and the lower wafer 62 held by the lower sample base 46. That is, the operator operates the ion gun 32 to irradiate charged particles into a space between the upper wafer 61 and the lower wafer 62 in the state that the upper wafer 61 held by the upper sample base 17 and the lower wafer 62 held by the lower sample base 46 are separated from each other. The charged particles are irradiated into the space between the upper wafer 61 and the lower wafer 62 to remove oxide films formed in the surfaces of the wafers and so on, and to remove impurities adhered to the surfaces thereof. The operator operates the pressure bonding mechanism 18 to lower the upper sample base 17 in the down direction and to approach the upper wafer 61 to the lower wafer 62. The operator adjusts the position of the lower wafer 62 held on the lower sample base 46 by the positioning mechanism such that the upper wafer 61 and the lower wafer 62 are bonded in accordance with a design. The operator operates the pressure bonding mechanism 18 for the upper sample base 17 to lower the upper sample base 17 in the down direction to perform the pressure bonding of the upper wafer 61 the lower wafer 62. The upper wafer 61 and the lower wafer 62 are bonded through the pressure bonding and one bonded substrate is produced.

After the bonded substrate is dechucked from the upper sample base 17, the operator operates to raise the upper sample base 17 in the up direction. Next, the operator opens the gate valve 5, and conveys the lower cartridge 12, on which the bonded substrate is put, from the lower sample base 46 to the lower cartridge base 7 by the conveyer unit 8. The operator closes the gate valve 5 and returns the inside space of the load lock chamber 3 to the ordinary pressure atmosphere. The operator opens the lid of the load lock chamber 3 and takes out the bonded substrate from the lower cartridge 12 arranged on the lower cartridge base 7.

In other conventional wafer bonding apparatuses in which upper sample base is directly fixed on an angle adjusting mechanism, the upper sample base deforms elastically in case of the pressure bonding such that the center portion of the upper sample base projects toward the lower sample base. At this time, there is a case that uniform load cannot be applied on the bonded surfaces of the upper wafer 61 and the lower wafer 62, because larger load is applied to the center portions of the upper wafer and the lower wafer than the outer edges of them. In the wafer bonding apparatus 1 of the present invention, uniform load can be applied onto the bonding surfaces of the upper wafer 61 and the lower wafer 62 in the pressure bonding of the upper wafer 61 and the lower wafer 62. As a result, in the wafer bonding apparatus 1, the production yield of the bonded substrate can be improved, and the reliability of the room-temperature bonding can be improved for practical use.

Another load transferring section may be used to apply the load from the upper stage 14 on the outer edge portion of the upper sample base 17 in place of the load transferring section 16.

Figure 5:
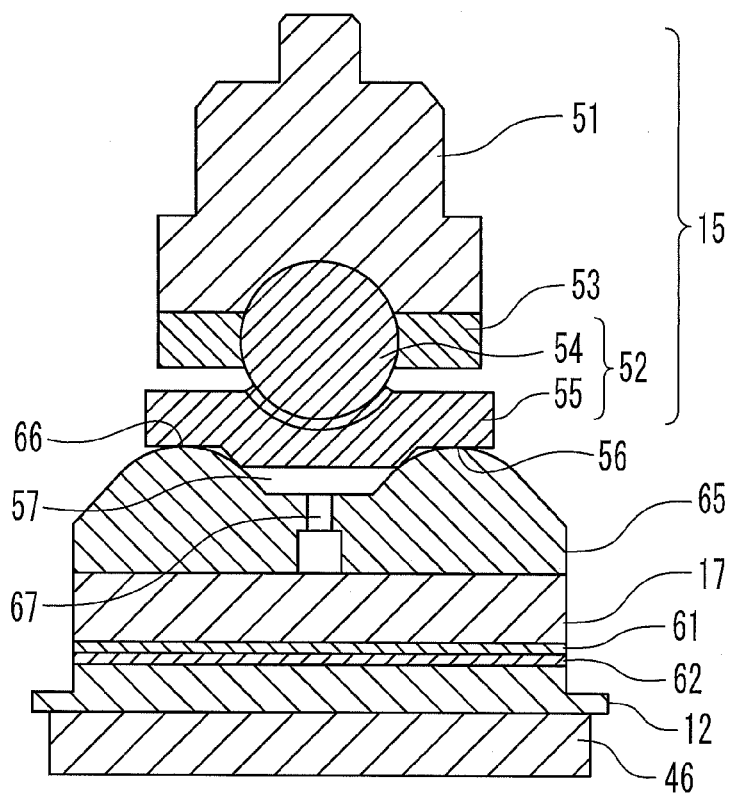
FIG. 5 is a sectional view showing another load transferring section.

FIG. 5 shows another example of the load transferring section. Like the load transferring section 16, the load transferring section 65 is formed in the shape of a disk. The load transferring section 65 has a concave portion formed at the center of the upper portion and a support surface 66 is formed on the upper portion. The support surface 66 has a curved surface which represents a part of the surface of a so-called doughnut shape formed by rotating an ellipse around a rotation axis. The rotation axis passes through the center of the disk of the load transferring section 65 perpendicularly to the disk. A bolt hole 67 is formed at the center of the disk of the load transferring section 65. A bolt (not shown) is inserted in the bolt hole 67 of the load transferring section 65 and is fastened to the supporting section 55 of the spherical flange 52. Thus, the load transferring section 65 is supported to the spherical flange 52 such that the support surface 66 makes line contact with the support surface 56 and the cavity 57 is formed at the center of the surface portion of the load transferring section 65 with which the supporting section 55 of the spherical flange 52 is in contact.

When the load applied from the upper stage 14 is small, the load transferring section 16 receives the load with the whole support surface 66. When the load applied from the upper stage 14 is large, the supporting section 55 of the spherical flange 52 deforms elastically and the load transferring section 16 receives the load with the edge of the support surface 58 on the center side. In this way, a position of the load transferring section 16 which receives the applied load from the upper stage 14 moves depending on the magnitude of the load applied from the upper stage 14. Therefore, the wafer bonding apparatus 1 has a possibility that the uniform load cannot be applied on the bonding plane of the upper wafer 61 and the lower wafer 62 when the load is large.

The load transferring section 65 reduces the movement of the position which receives the load applied from the upper stage 14. As a result, the wafer bonding apparatuses to which the load transferring section 65 is applied can apply a uniform load on the bonding surfaces of the upper wafer 61 and the lower wafer 62 even when the magnitude of the load applied from the upper stage 14 is changed.

Figure 6:
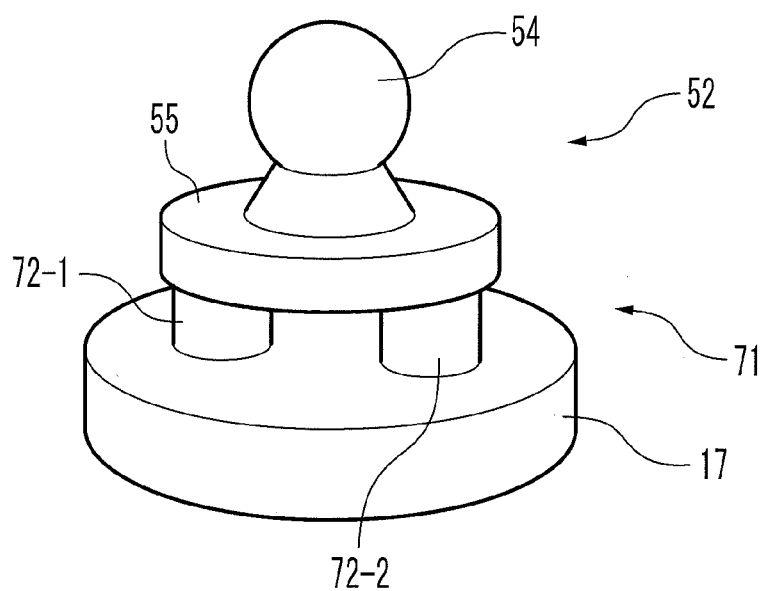
FIG. 6 is a sectional view showing still another load transferring section.

FIG. 6 shows another example of the load transferring section. The load transferring section 71 is formed from a plurality of columnar members 72-1 to 72-$n$ ($n$=3, 4, . . . ). The plurality of columnar members 72-1 to 72-$n$ are respectively arranged in a plurality of positions obtained by equally dividing the outer edge of the upper sample base 17. One end of each 72-$i$ ($i$=1, 2, 3, . . . , n) of the plurality of columnar members 72-1 to 72-$n$ is fixed on the supporting section 55 of the spherical flange 52 and the other end is fixed on the outer edge of the upper sample base 17.

In the wafer bonding apparatus to which such a load transferring section 71 is applied, when the pressure bonding is performed on the upper wafer 61 and the lower wafer 62, the uniform load can be applied on the bonding surfaces of the upper wafer 61 and the lower wafer 62, like the above wafer bonding apparatus 1. Thus, the reliability of the bonding can be improved.

Figure 7:
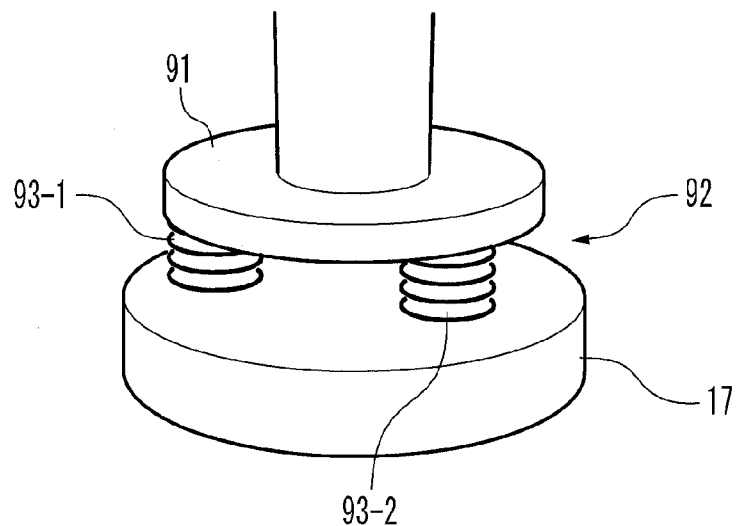
FIG. 7 is a sectional view showing yet still another load transferring section.

FIG. 7 shows another example of the load transferring section. The load transferring section 92 is formed from a plurality of springs 93-1 to 93-$n$. The plurality of springs 93-1 to 93-$n$ are respectively arranged in a plurality of regions obtained by equally dividing the outer edge of the upper sample base 17 into n regions. Each 93-$i$ of the plurality of springs 93-1 to 93-$n$ is fixed on a supporting section 91 which is fixed on the supporting section 55 of the spherical flange 52 at one end and fixed on the outer edge of the upper sample base 17 at the other end.

In the wafer bonding apparatus to which such a load transferring section 92 is applied, like the above wafer bonding apparatus 1, when the pressure bonding is performed on the upper wafer 61 and the lower wafer 62, a uniform load can be applied on the bonding surfaces of the upper wafer 61 and the lower wafer 62. Thus, the reliability of the bonding can be improved. Also, in the wafer bonding apparatus to which such a load transferring section 92 is applied, when the upper wafer 61 and the lower wafer 62 are not in parallel to each other, the plurality of springs 93-1 to 93-$n$ deform elastically such that the upper wafer 61 and the lower wafer 62 become parallel to each other in the pressure bonding. Therefore, in such a wafer bonding apparatus, even when the upper wafer 61 and the lower wafer 62 are not parallel to each other, the uniform load is applied to the bonding surfaces of the upper wafer 61 and the lower wafer 62 in the pressure bonding. As a result, in such a wafer bonding apparatus, it is not necessary to adjust the hold surface of the upper sample base 17 and the hold surface of the lower sample base 46 by the angle adjusting mechanism 15 before the pressure bonding, and the pressure bonding can be more easily performed on the upper wafer 61 and the lower wafer 62. Moreover, the angle adjusting mechanism 15 can be omitted and such a wafer bonding apparatus can be cheaply manufactured.

Another angle adjusting mechanism may be used to fix the direction of the upper sample base 17 on a predetermined direction in place of the angle adjusting mechanism 15.

Figure 8:
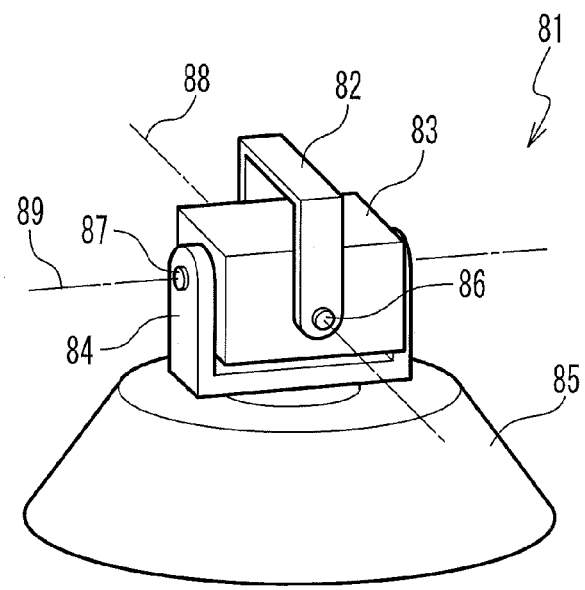
FIG. 8 is a perspective view showing another angle adjusting mechanism.

FIG. 8 shows an example of another angle adjusting mechanism. The angle adjusting mechanism 81 includes a first frame 82, an intermediate body 83, a second frame 84 and a supporting section 85. The first frame 82 is fixed on the upper stage 14. The intermediate body 83 is supported by the first frame 82 with a bolt 86 rotatably around a rotation axis 88. The rotation axis 88 extends in parallel to a horizontal direction and is fixed to the first frame 82. The bolt 86 is fastened to the intermediate body 83 to fix the intermediate body 83 on the first frame 82. The second frame 84 is supported by the intermediate body 83 with a bolt 87 rotatably around a rotation axis 89. The rotation axis 89 extends in parallel to the horizontal direction and is perpendicular to the rotation axis 88 and is fixed to the intermediate body 83. The bolt 86 is fastened to the intermediate body 83 to fix the first frame 82 on the intermediate body 83. The supporting section 85 is formed in the shape of a disk and the center of the disk is fixed on the second frame 84. Moreover, in the supporting section 85, a flat support surface is formed on the back surface opposing to the surface bonded with the second frame 84. Like the above angle adjusting mechanism 15, the angle adjusting mechanism 81 supports the load transferring section 16 such that the support surface of the supporting section 85 fits to the support surface 58 of the load transferring section 16 and that the cavity 57 is formed in the load transferring section 16.

The wafer bonding apparatus to which the angle adjusting mechanism 81 is applied can apply a uniform load on the bonding surfaces of the upper wafer 61 and the lower wafer 62 when the pressure bonding is performed on the upper wafer 61 and the lower wafer 62, like the wafer bonding apparatus 1. Thus, the reliability of the bonding can be improved.

The wafer bonding apparatus of the present invention can prevents that a load larger than load applied on the outer edge of the first substrate is applied at the center of the first substrate when the first substrate and the second substrate are subjected to the pressure bonding, and the load can be uniformly applied on the first substrate and the second substrate.

The invention claimed is:

1. A wafer bonding apparatus comprising:
    an upper sample base provided in a bonding chamber and configured to hold a first substrate;
    a lower sample base provided in said bonding chamber and configured to hold a second substrate to oppose to said first substrate;
    a load transferring section transferring a point load to an outer edge portion of said upper sample base and configured to support said upper sample base to a first stage, wherein said load transferring section is provided in said bonding chamber;
    an angle adjusting mechanism provided in said bonding chamber and configured to support said first sample base to said first stage through said load transferring section such that an orientation of said first sample base is changeable during bonding of said first substrate to said second substrate; and
    a drive unit configured to perform pressure bonding on said first substrate and said second substrate by driving said first stage to said second sample base.

2. The wafer bonding apparatus according to claim 1, wherein said the angle adjusting mechanism comprises:
    a spherical flange fixed on said upper sample base;
    a spherical base fixed on said first stage; and
    a fixation flange configured to fix said sphere flange on said sphere base by swaging said sphere flange.

3. The wafer bonding apparatus according to claim 2, wherein said angle adjusting mechanism is in line-contact with said load transferring section such that said load transferring section is supported by said angle adjusting mechanism.

4. The wafer bonding apparatus according to claim 2, wherein said load transferring section comprises a plurality of columnar members, each of which is coupled at one end to the outer edge portion of said upper sample base and at the other end to said angle adjusting mechanism.

5. The wafer bonding apparatus according to claim 1, wherein said load transferring section comprises a plurality of columnar members, which deform elastically such that said first substrate and said second substrate fit to each other when the pressure bonding of said first substrate and said second substrate is performed.

* * * * *